United States Patent
Kirmse et al.

(10) Patent No.: US 12,463,088 B2
(45) Date of Patent: *Nov. 4, 2025

(54) SELECTIVE ETCHES FOR REDUCING CONE FORMATION IN SHALLOW TRENCH ISOLATIONS

(71) Applicant: Texas Instruments Incorporated, Dallas, TX (US)

(72) Inventors: Karen Hildegard Ralston Kirmse, Richardson, TX (US); Jonathan Philip Davis, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/530,423

(22) Filed: Dec. 6, 2023

(65) Prior Publication Data

US 2024/0105501 A1    Mar. 28, 2024

Related U.S. Application Data

(60) Continuation of application No. 17/478,306, filed on Sep. 17, 2021, now Pat. No. 11,908,729, which is a
(Continued)

(51) Int. Cl.
*H01L 21/762*  (2006.01)
*H01L 21/3065* (2006.01)
(Continued)

(52) U.S. Cl.
CPC .... *H01L 21/76229* (2013.01); *H01L 21/3065* (2013.01); *H01L 21/308* (2013.01); *H01L 21/31116* (2013.01); *H10D 62/115* (2025.01)

(58) Field of Classification Search
None
See application file for complete search history.

(56) References Cited

U.S. PATENT DOCUMENTS 6,890,859 B1   5/2005   Bamnolker
9,076,668 B2   7/2015   Jing
(Continued)

FOREIGN PATENT DOCUMENTS

CN   103515290 A   1/2014
CN   103579074 A   2/2014
(Continued)

OTHER PUBLICATIONS

Search Report for PCT Application No. PCT/US2018/065235, Mailing Date Apr. 18, 2019, 1 pg.
(Continued)

*Primary Examiner* — Long Pham
(74) *Attorney, Agent, or Firm* — Yudong Kim; Frank D. Cimino

(57) ABSTRACT

Techniques of fabricating shallow trench isolation structures that reduce or minimize the number of trench cones during the formation of shallow trenches. The disclosed techniques introduce separate etch steps for etching shallow trenches with small feature dimensions and for etching shallow trenches with large feature dimensions. As an example, the disclosed techniques involve etching a first shallow trench in a first region of a substrate with a first etching parameter, and etching a second shallow trench in a second region of a substrate with a second etching parameter different from the first etching parameter. Among other things, the etching parameter may include an etching selectivity ratio of silicon to an etch retardant that contributes to cone formations. Because of the separate etch steps, the disclosed techniques allow the sidewall slopes between the first and second shallow trenches to be within a few degrees of deviation.

18 Claims, 9 Drawing Sheets

Related U.S. Application Data division of application No. 16/567,661, filed on Sep. 11, 2019, now Pat. No. 11,171,035, which is a continuation of application No. 15/852,171, filed on Dec. 22, 2017, now Pat. No. 10,453,738.

(51) Int. Cl.
*H01L 21/308* (2006.01)
*H01L 21/311* (2006.01)
*H10D 62/10* (2025.01)

(56) References Cited

U.S. PATENT DOCUMENTS

| | | |
|---|---|---|
| 9,899,382 B2 * | 2/2018 | Huang ............... H10D 84/0179 |
| 11,908,729 B2 * | 2/2024 | Kirmse ................ H10D 62/115 |
| 2005/0042837 A1 | 2/2005 | Hong |
| 2007/0059897 A1 | 3/2007 | Tilke et al. |
| 2009/0087960 A1 | 4/2009 | Cho et al. |
| 2011/0244687 A1 | 10/2011 | Oohara et al. |
| 2012/0056305 A1 | 3/2012 | Kuo |
| 2013/0334607 A1 | 12/2013 | Fumitake |
| 2014/0021517 A1 | 1/2014 | Cheng |
| 2014/0231017 A1 | 8/2014 | Nishizuka et al. |
| 2014/0273388 A1 | 9/2014 | Jing et al. |
| 2015/0004773 A1 * | 1/2015 | Deng .................. H01L 21/3105 438/424 |
| 2015/0371940 A1 | 12/2015 | Liu |
| 2017/0012098 A1 * | 1/2017 | Park ...................... H10B 12/30 |
| 2017/0033279 A1 | 2/2017 | Lee |
| 2018/0175040 A1 * | 6/2018 | Kim .................. H01L 21/76224 |
| 2018/0366323 A1 | 12/2018 | Huang |

FOREIGN PATENT DOCUMENTS

| | | |
|---|---|---|
| JP | 2003224109 A | 8/2003 |
| JP | 2007311659 A | 11/2007 |
| KR | 20020013141 A | 2/2002 |
| TW | 201133839 A | 10/2011 |

OTHER PUBLICATIONS

First Office Action issued in corresponding Chinese Patent Application No. 201880070450.4, dated Oct. 28, 2023, 10 pgs.
Notice of Allowance in corresponding China Patent Application No. 201880070450.4, dated Mar. 29, 2024, 5 pgs.

* cited by examiner

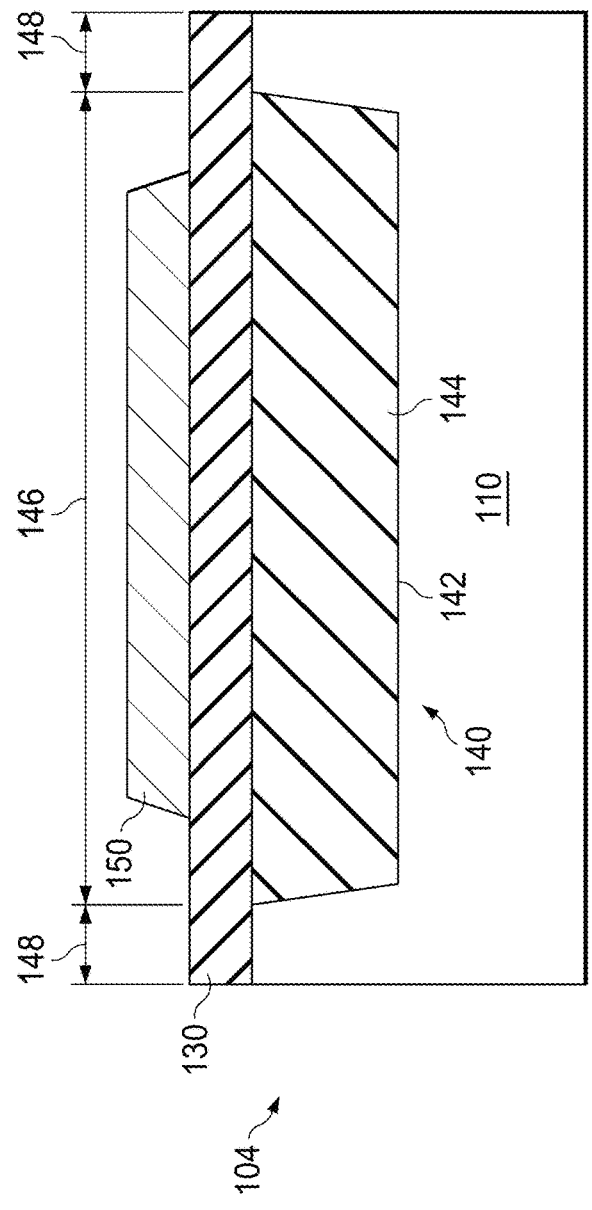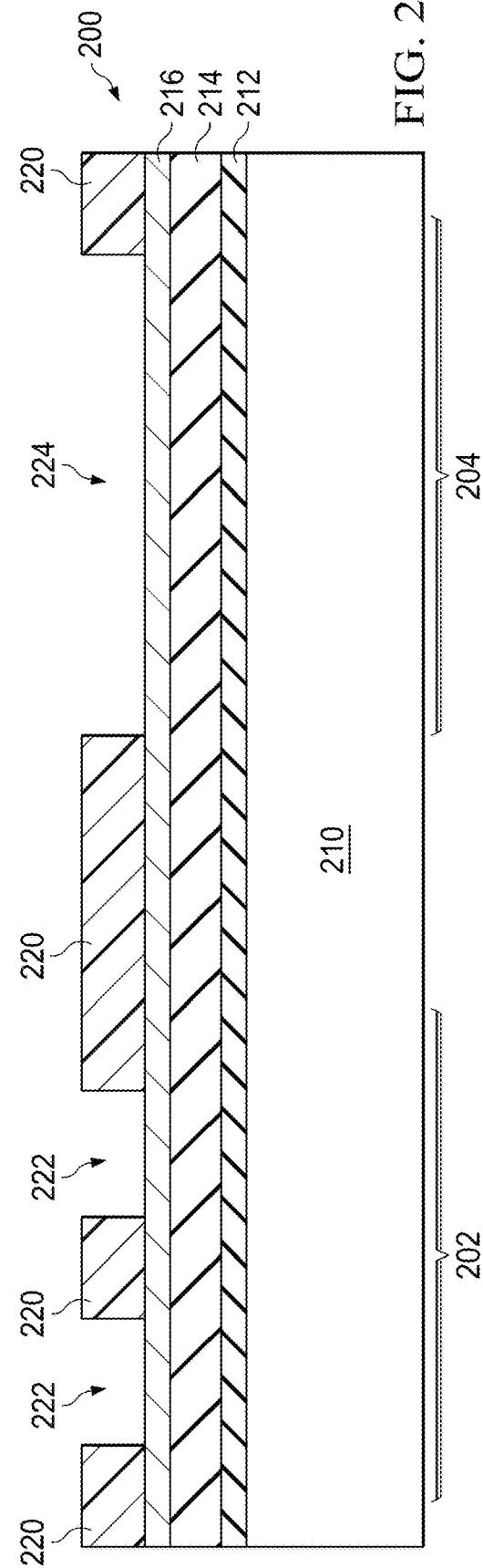

SELECTIVE ETCHES FOR REDUCING CONE FORMATION IN SHALLOW TRENCH ISOLATIONS

CROSS REFERENCE TO RELATED APPLICATIONS

This application is a continuation of U.S. patent application Ser. No. 17/478,306, filed Sep. 17, 2021, which is a division of U.S. patent application Ser. No. 16/567,661, filed Sep. 11, 2019, now U.S. Pat. No. 11,171,035, which is a continuation of U.S. patent Application Ser. No. 15/852,171, filed Dec. 22, 2017, now U.S. Pat. No. 10,453,738, which applications are hereby incorporated herein by reference.

BACKGROUND

Shallow trench isolation (STI) structures are often used in semiconductor devices for providing electrical isolation among transistors. The fabrication process of STI structure may produce cosmetic defects such as trench cones, which typically do not impact the electrical isolation capability of the STI structures. As the demand for high voltage devices surges in recent years, STI structures have been integrated to form high voltage devices, in which the STI structures may be adapted as a high voltage barrier between an upper conductive plate and a lower substrate. In certain configurations, trench cones may alter the average thickness of an STI structure, which may affect the high voltage performance of the integrated device.

SUMMARY

The present disclosure describes techniques for fabricating shallow trench isolation structures that reduce or minimize the number of trench cones during the formation of the shallow trenches. The disclosed techniques introduce separate etch steps for etching shallow trenches with small feature dimensions and for etching shallow trenches with large feature dimensions. In one implementation, for example, the disclosed techniques involve etching a first shallow trench in a first region of a substrate with a first etching parameter, and etching a second shallow trench in a second region of a substrate with a second etching parameter different from the first etching parameter. The etching parameter may include an etching selectivity ratio of silicon to an etch retardant that contributes to cone formations. The etching parameter may also include the feature dimension and trench density of the respective shallow trench. Moreover, the etching parameter may further include a bias power used for controlling a plasma anisotropic etch. Because of the separate etch steps, the disclosed techniques allow the sidewall slopes between the first and second shallow trenches to be within a 15 degrees of deviation.

DRAWING DESCRIPTIONS

FIG. 1C shows a cross-sectional view of a second region of the integrated circuit according to an aspect of the present disclosure.

FIGS. 2A-2B show the partial cross-sectional views of an integrated circuit during a trench formation process.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1A:
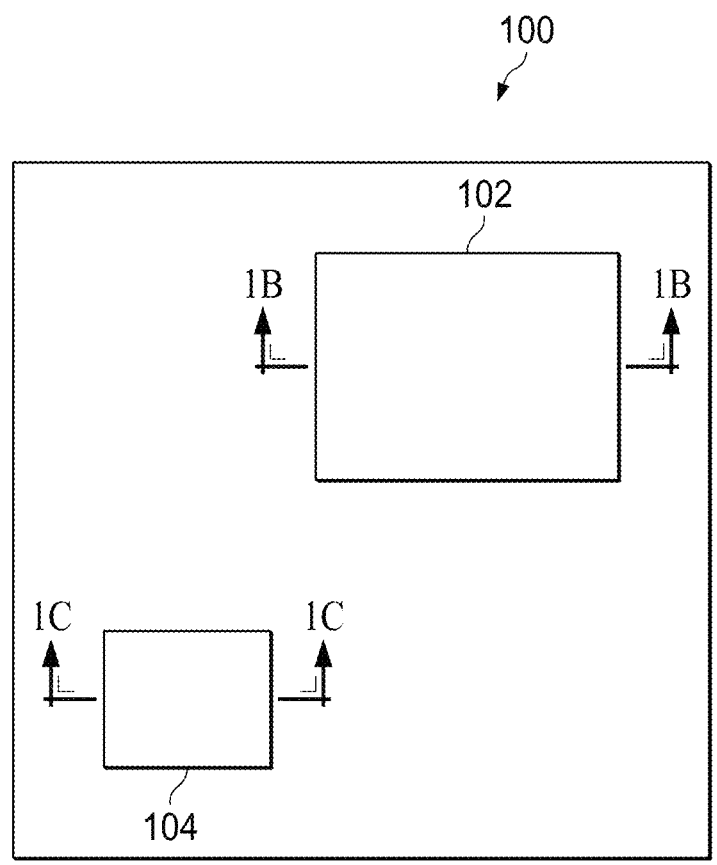
FIG. 1A shows a top view of an integrated circuit according to an aspect of the present disclosure.
Figure 1B:
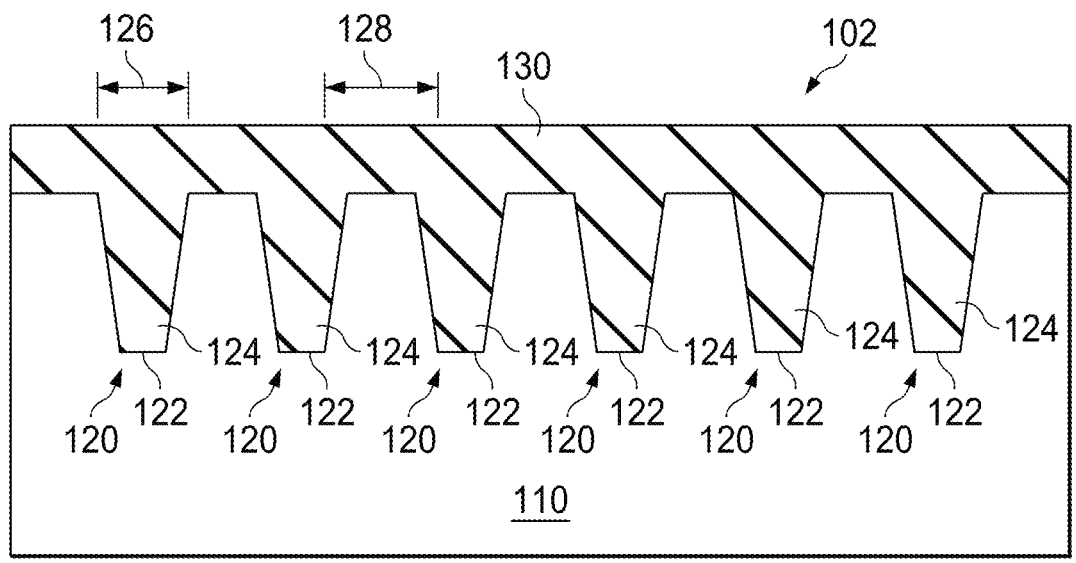
FIG. 1B shows a cross-sectional view of a first region of the integrated circuit according to an aspect of the present disclosure.

FIG. 1A shows a top view of an integrated circuit (IC) 100 according to an aspect of the present disclosure. The IC 100 may be divided into a first region 102 and a second region 104 for the purpose of forming different types of shallow trenches. FIG. 1B shows a cross-sectional view of the first region 102, whereas FIG. 1C shows a cross-sectional view of the second region 104. As shown in each of FIGS. 1B and 1C, the IC 100 includes a semiconductor substrate 110, which can be a bulk silicon substrate, a silicon-on-insulator (SOI) substrate, and/or a silicon substrate with epitaxial layer(s) developed thereon.

The semiconductor substrate 110 can also be divided into the first region 102 and the second region 104. Although FIGS. 1A-1C show that the first region 102 are distinctive and distanced from the second region 104, these two regions 102 and 104 may be intertwined with each other. In general, first isolation structures 120 are positioned within the first region 102, while second isolation structures 140 are positioned within the second region 104. The first region 102 may have a higher component density (e.g., number of active and passive components per micron square) than the second region 104.

As shown in FIG. 1B, the first isolation structures 120 are positioned along a top surface of the semiconductor substrate 110. Each of the first isolation structure 120 includes a first shallow trench 122 filled with first trench dielectric 124. The first trench dielectric 124 may include silicon dioxide or other suitable dielectric material. The first trench dielectric 124 may be deposited either together with, or separately from, a dielectric layer 130 on top of the semiconductor substrate 110.

The first isolation structures 120 can be used for providing lateral isolation between transistor structures. Thus, various types of transistors can be formed between adjacent first isolation structures 120. In one configuration, for example, a CMOS transistor can be formed between two adjacent first isolation structures 120. In another configuration, for example, a bipolar junction transistor can be formed between two adjacent first isolation structures 120. In yet another configuration, for example, a memory cell transistor can be formed between two adjacent first isolation structures 120.

For performing the function of lateral isolation, each of the first isolation structures 120 has one or more feature dimension specifications, which may include a first trench width 126 and a first inter-trench spacing (ITS) 128. Together, the first trench width 126 and the first ITS 128 define a first trench density of the first isolation structures 120, which can be understood as the number of first shallow trenches 122 per unit area (e.g., a cross-sectional area as shown in FIG. 1B).

As shown in FIG. 1C, the second isolation structure 140 is positioned along a top surface of the semiconductor substrate 110. Although FIG. 1C illustrates only a single isolation structure 140, multiple instances of the second isolation structure 140 can be formed within the second region 104. The second isolation structure 140 includes a second shallow trench 142 filled with second trench dielectric 144. The second trench dielectric 144 may include silicon dioxide or other suitable dielectric material. The second trench dielectric 144 may be deposited either together with, or separately from, a dielectric layer 130 on top of the semiconductor substrate 110.

The second isolation structure 140 can be used as a high voltage barrier for forming a high voltage device. In particular, the second isolation structure 140 may be integrated with a circuit component 150 along a vertical direction of the IC 100. The circuit component 150 is a structure that is configured to receive a high voltage (e.g., greater than 15V), and it may include a conductive material such as doped polysilicon, metal, and/or alloy. In one configuration, for example, the circuit component 150 can be a gate structure of a lateral diffused MOS transistor. In another implementation, for example, the circuit component 150 can be a resistor strip. In yet another implementation, for example, the circuit component 150 can be a part of an inductor coil. In still another implementation, for example, the circuit component 150 can be an electrode of a capacitor.

For performing the function of a high voltage barrier, the second isolation structures 140 has one or more feature dimension specifications, which may include a second trench width 146 and a second inter-trench spacing (ITS) 148. Together, the second trench width 146 and the second ITS 148 define a second trench density of the second isolation structures 140, which can be understood as the number of second shallow trenches 142 per unit area (e.g., a cross-sectional area as shown in FIG. 1C).

In general, the feature dimensions of the second isolation structure 140 are greater than the feature dimensions of the first isolation structure 120. In one implementation, for example, the second trench width 146 may be at least 2 times greater than the first trench width 126. In another implementation, for example, the second ITS 148 may be at least 2 times greater than the first ITS 128.

The difference in feature dimensions is attributable to the different functions served by the first isolation structure 120 and by the second isolation structure 140. One the one hand, the first region 102 (within which the first isolation structures 120 are positioned) is designated for compact circuitry that does not typically handle high voltage operations. As such, the first region 102 may benefit from isolation structures with smaller feature dimensions and higher trench density. On the other hand, the second region 104 (within which the second isolation structures 140 are positioned) is designated for high voltage operations that will likely impose high electric fields between the circuit component 150 and the substrate 110. As such, the second region 104 may benefit from isolation structures with greater feature dimensions and lower trench density.

Figure 2B:
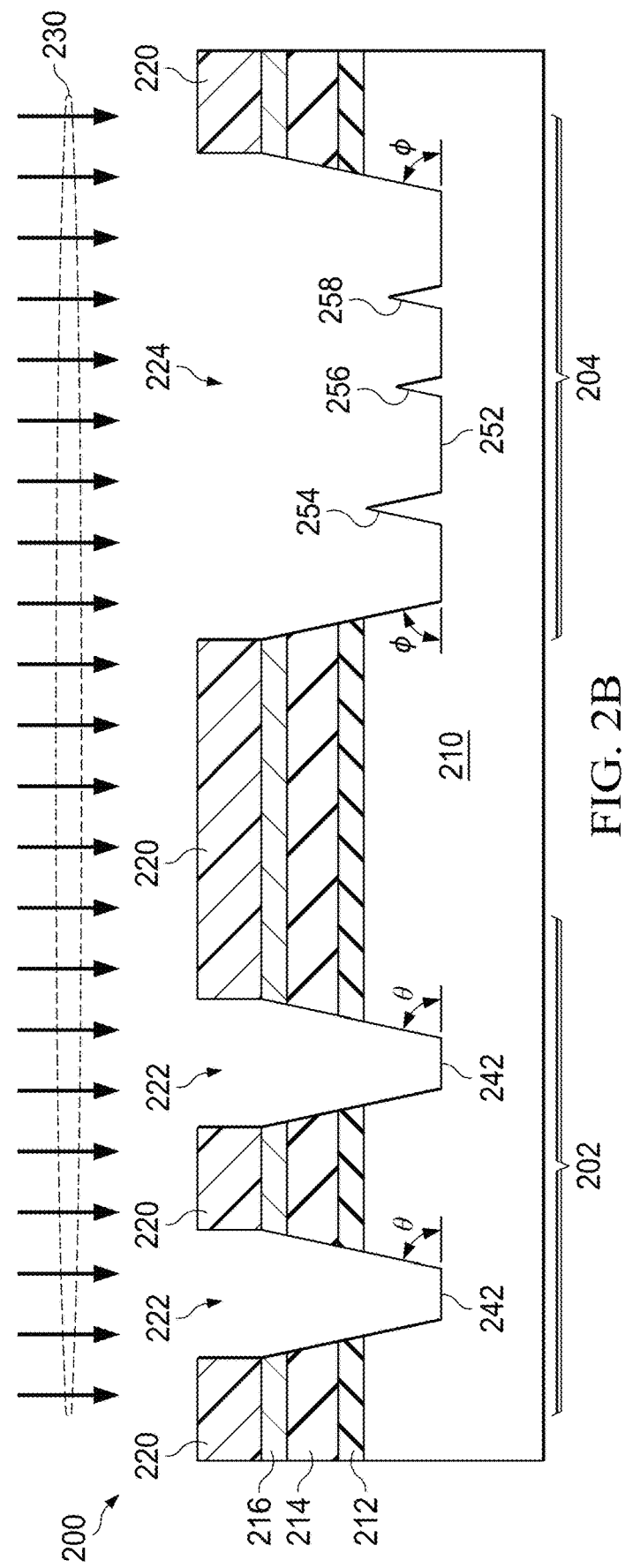

FIGS. 2A-2B show the partial cross-sectional views of an integrated circuit (IC) 200 during a trench formation process. The IC 200 has a similar topology as the IC 100, in that the IC 200 includes a semiconductor substrate 210 that is divided into a first region 202 and a second region 204 in a manner consistent with the description of FIGS. 1A-1C.

Referring to FIG. 2A, one or more layers of dielectric material can be deposited directly on the substrate 210 before the trench formation process. In one implementation, for example: a pad oxide layer (e.g., silicon oxide) 212 is deposited directly on a top surface of the substrate 210; a cap nitride layer (e.g., silicon nitride) 214 is deposited directly on the pad oxide layer 212; and a bottom antireflective coating (BARC) layer (e.g., a layer with hydrocarbon material) 216 is deposited directly on the cap nitride layer 214. Pad oxide layer 212 is deposited to enhance the adhesion of the subsequent cap nitride layer 214, which serves as a mask layer, to the substrate 210. The cap nitride layer 214 is a mask layer used to protect the substrate during later steps such as Chemical Mechanical Polishing (CMP). The BARC layer 216 is deposited to limit unwanted reflections from the wafer surface during the resist patterning process.

A photoresist mask 220 is formed and patterned above the substrate 210 to define the locations of shallow trenches in the first region 202 and in the second region 204 respectively. For instance, the photoresist mask 220 is patterned with first openings 222 for etching shallow trenches in the first region 202, and it is also patterned with a second opening 224 for etching a wider shallow trench in the second region 204. For the sake of simplicity, FIG. 2A shows that the photoresist mask 220 is patterned with only one opening 224 above the second region 204. But in practice, the photoresist mask 220 may be patterned with multiple openings 224 above the second region 204.

After the photoresist mask 220 is patterned, the trench formation process will undergo one or more etch steps depending on the composition of the dielectric layers 212, 214, and 216. Referring to FIG. 2B, the etch steps 230 are commonly applied to both the first region 202 and the second region 204. The etch steps 230 may each includes a plasma anisotropic etch, which is a form of dry reactive ion etch. A first plasma etch can remove the BARC layer 216 with a chlorine ($Cl_2/O_2$) etchant, a hydrogen bromide (HBr/$O_2$) etchant, a carbon tetrafluoride ($CF_4/O_2$) etchant, and/or an oxygen (O2/N2) etchant. A second plasma etch can remove the nitride layer 214 and the oxide layer 212 with a carbon tetrafluoride ($CF_4$/CHF3/Ar) etchant, a fluoroform ($CHF_3$/Ar) etchant, and/or a (CHF3/SF6) etchant. A third plasma etch may serve as a breakthrough etch to remove a top portion of the substrate 210 as well as the polymer by-products left over from the first and second plasma etches. The third plasma etch may apply a carbon tetrafluoride ($CF_4$/Ar) etchant, CHF3/SF6 and/or an argon (Ar) etchant. A fourth plasma etch is used to etch into the silicon substrate 110. The fourth plasma etch may apply a Cl2/O2/N2, HBr/O2, Cl2/HBr/O2, Cl2/HBr/CF4 and/or Cl2/O2/SF6 etchant. The first shallow trenches 242 and the second shallow trench 252 are formed after the fourth plasma etch as described below.

The third plasma etch is timed to remove etch polymers, particles and/or remaining nitride/oxide from the first and second plasma etches. If the third plasma etch is too short in duration or too high in selectivity, the substrate 210 may be covered by a substantial amount of contaminating polymer, remaining nitride or oxide particles that contribute to cone formation. The third plasma etch may have a faster photoresist etch rate which can affect the critical dimension (CD) control of the smaller feature dimensions. In practice this may limit the etch time permitted for the first shallow trench 242. In contrast, the larger features of second shallow trench etch are less sensitive to CD variation and the larger feature size may allow thicker photoresist and/or amorphous carbon masking layers than the first shallow trench etch. The reduced CD sensitivity and thicker masking layers allow a longer third plasma etch with increased removal of polymer and etch retardants. The fourth plasma etch time could then be adjusted for the second trench etch if it is desired to keep the depths of the first and second silicon etches similar.

The fourth plasma etch has a certain selectivity profile that is precision-tuned for etching the first shallow trenches 242. The selectivity profile of the fourth plasma etch may create a performance trade-off between the first shallow trench 242 and the second shallow trench 252. On the one hand, achieving the smaller feature dimensions of the first shallow trenches 242 depends on a higher selectivity profile. For reference, a selectivity profile for etching a trench (e.g., 242 and/or 252) into a silicon substrate (e.g., 210) can be represented by a silicon selectivity ratio, which can be a rate of removing a silicon material over removing one or more etch retardant materials other than the silicon material. These etch retardants can be fabrication by-products and/or process by-products. For example, these etch retardants may include contaminating etch by-product polymers, oxide material, nitride material, contaminating particles, and/or hydrocarbon material remaining from the first and second plasma etches.

Because the second shallow trench 252 has a greater width than the first shallow trench 242, the etched surface of the second shallow trench 252 is more susceptible to receiving a greater amount of etch byproducts during the fourth plasma etch. When left on an etched sidewall of the second shallow trench 252, these polymer by-products may impede the etch rate of the sidewall because they slow down the etching of the underlying silicon material. As a result, the second shallow trench 252 may have a lesser sidewall slope than the first shallow trench 242.

However, when left on a bottom etched surface of the second shallow trench 252, the polymer by-products may block the etching of the underlying silicon material because of the highly selective profile. As a result, trench cones 254, 256, and 258 are formed at the bottom of the second shallow trench 254. These trench cones 254, 256, and 258 disturb the thickness distribution of the trench dielectric layer (e.g., 144), which may lower the electric field barrier across some parts of the trench dielectric layer. As such, trench cone formation may impact the performance of high voltage devices that operate with high electric fields across the second shallow trench 252.

The present disclosure provides a solution to achieve high precision in a first group of shallow trenches with small feature dimensions as well as high performance in a second group of shallow trenches that support high voltage operations. The disclosed solution introduces a two-pass etch process to segregate the formation of the first group of shallow trenches (i.e., high precision trenches) from the formation of the second group of shallow trenches (i.e., high performance trenches). The disclosed solution trade-off the low cost, simplistic approach of the one-pass etch process (e.g., FIGS. 2A-2B) with the high-precision, high-performance benefits of the two-pass etch process (e.g., FIGS. 3, 4A-4E).

Figure 3:
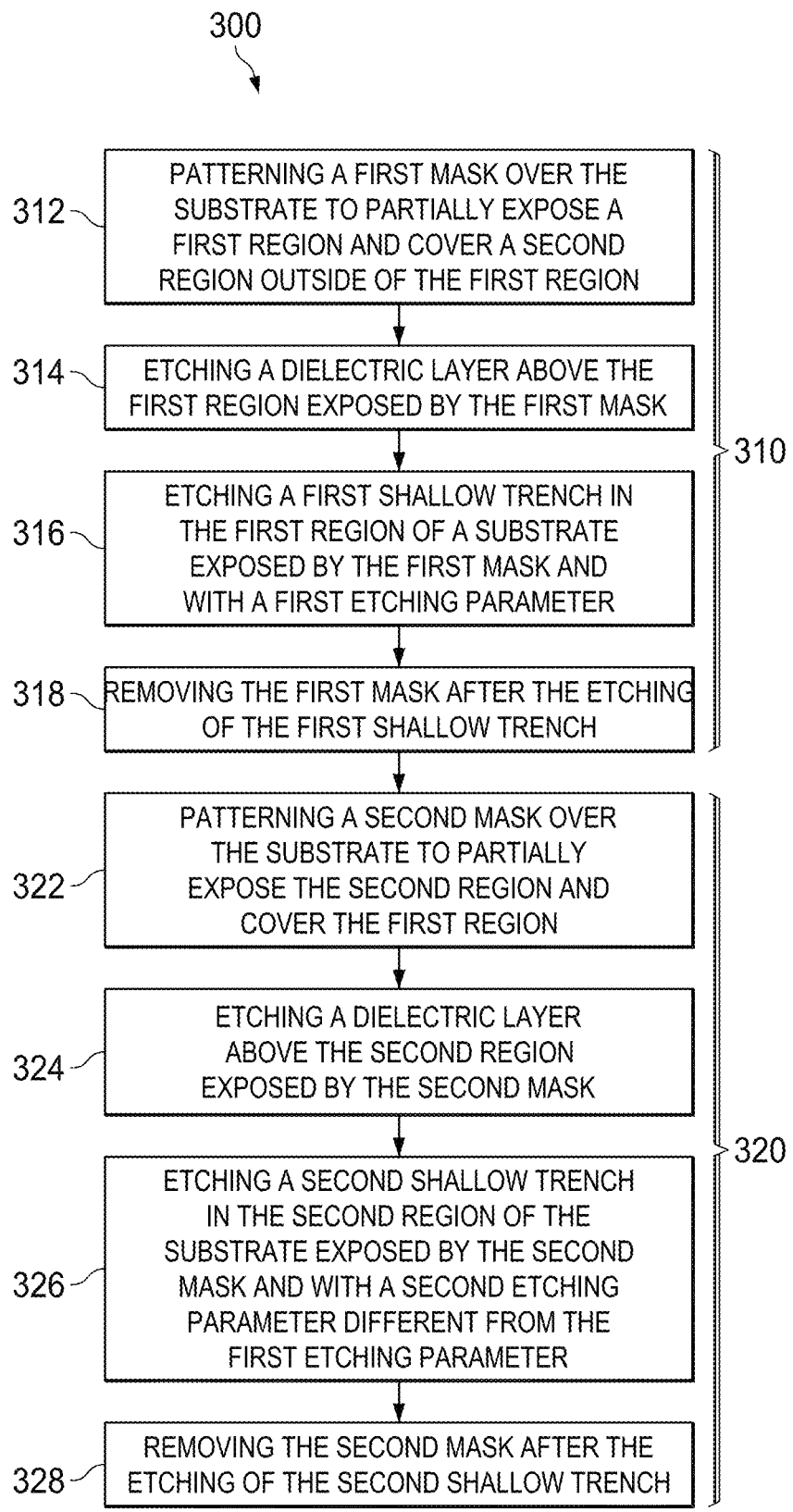
FIG. 3 shows a flow chart of a method deploying separate etch steps to form a first shallow trench and a second shallow trench according to an aspect of the present disclosure.

As shown in FIG. 3, for example, a method 300 of a two-pass etch process can be implemented by a first trench formation process 310 and a second trench formation process 320. The first trench formation process 310 is for etching a first group of shallow trenches with a first set of etching parameters associated with high precisions in small feature dimensions. The second trench formation process 320 is for etching a second group of shallow trenches with a second set of etching parameters associated with high performance barriers having little to no cone formation. In one implementation, the first trench formation process 310 can be performed before the second trench formation process 320. The advantage of such an implementation includes the ease of patterning the smaller features while the wafer surface is still planar. Alternatively, the first trench formation process 310 can be performed after the second trench formation process 320. The alternative implementation advantageously allows the first trench formation to be less likely to accumulate process defects from the second trench formation.

According to one aspect, the first and second etching parameters may each include a silicon selectivity ratio, which can be understood as a rate of removing a silicon material over removing an etch retardant from one or more fabrication steps and/or process steps. For instance, the etch retardant may include the residues or contaminating polymers left over from the removal of dielectric layers above the silicon substrate, residual oxide or nitride from the dielectric layers, particle contamination, or polymer by-products from the silicon etch. More particularly, the etch retardant may consist of an oxide material, a nitride material, a hydrocarbon material, and combinations thereof.

To achieve high precision etching for the first group of shallow trenches, the first silicon selectivity ratio is relatively high. In one implementation, for example, the first silicon selectivity ratio may be greater than 10. By contrast, the second silicon selectivity ratio is relatively low so as to reduce or minimize cone formations during the etching of the second group of shallow trenches. In one implementation, for example, the second silicon selectivity ratio may be less than 5.

According to another aspect, the first and second etching parameters may each include a bias power for controlling a plasma anisotropic etch. In general, the level of the bias power corresponds to the amount of ion bombardments onto a surface to be etched. A high amount of ion bombardments may provide physical sputtering to remove by-products and trench cones, as well as producing a greater (i.e., more vertical) sidewalls slope for a shallow trench that is etched with a relatively low silicon selectivity ratio.

To achieve high precision etching for the first group of shallow trenches, the first bias power is relatively low. By contrast, the second bias power is relatively high so as to reduce or minimize cone formations during the etching of the second group of shallow trenches. In one implementation, for example, the second bias power may be 1.3 to 2 times higher than the first bias power.

According to yet another aspect, the first and second etching parameters may each include a feature dimension of the respective shallow trenches and a trench density of the region within which the respective shallow trenches are located. Consistent with the above descriptions, the second group of shallow trenches have a greater feature dimension than the first group of shallow trenches, whereas the first region has a greater trench density than the second region.

According to still another aspect, the first and second etching parameters may each include process steps with different etch times. The first parameter etch times for etching the first group of shallow trenches can be the same as the second parameter etch times for the second group of shallow trenches. However, the first parameter etch times for the lower selectivity steps used to reduce cone formation may be less than the second parameter etch times for the lower selectivity steps for the second trench etch to avoid profile changes in the first group of shallow trenches and to provide sufficient time for removing trench cones in the second group of shallow trenches. The etch times for the fourth or other process steps would be adjusted to achieve the desired depths for the first and second etching parameters.

Figure 4A:
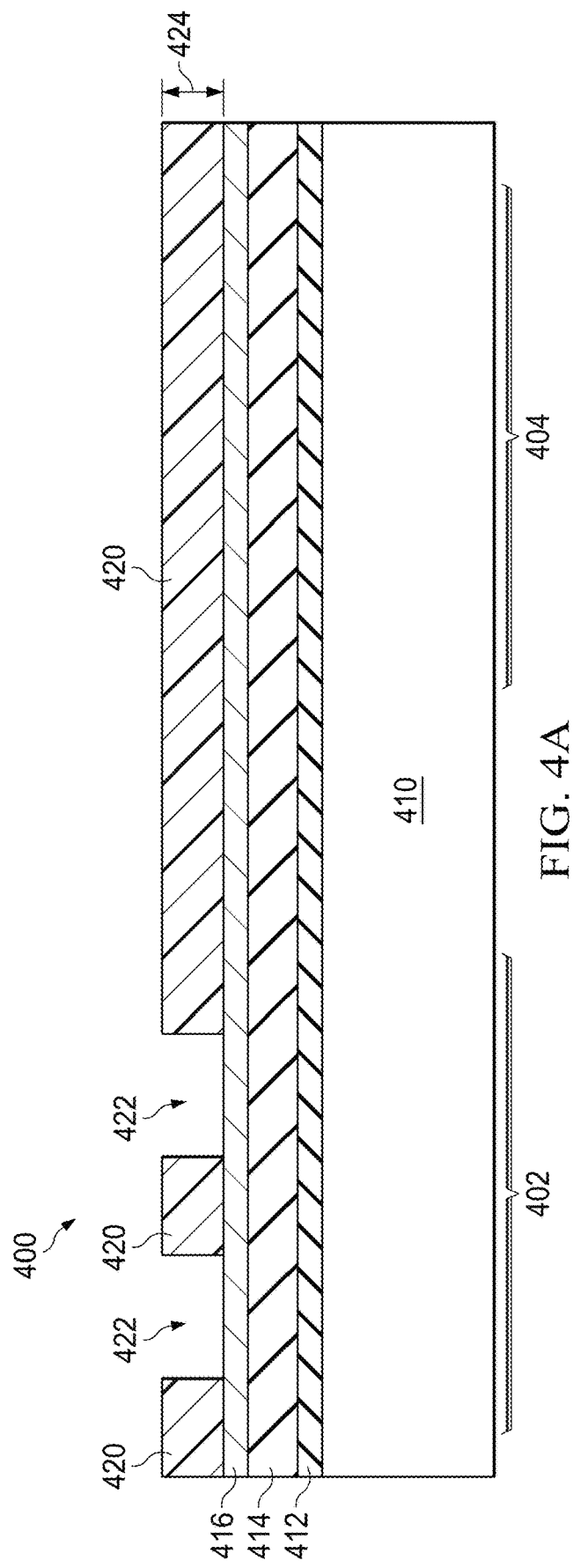
FIGS. 4A-4E show the partial cross-sectional views of an integrated circuit during a fabrication process that implements the method as shown in FIG. 3.

The method 300 of the two-pass etch process begins at step 312, which involves patterning a first mask over the substrate to partially expose a first region and cover a second region outside of the first region. With reference to FIG. 4A, for instance, a first photoresist mask 420 is deposited onto a stack of dielectric layers with substantially the same topology as shown and described in FIG. 2A. In particular, the stack of dielectric layers may include an oxide layer 412 on a silicon substrate 410, a nitride layer 414 on the oxide layer 412, and a BARC layer 416 on the nitride layer 414. The material compositions of the substrate 410 and the dielectric layers 412, 414, and 416 are substantially the same as the substrate 210 and the dielectric layers 212, 214, and 216 respectively. The first photoresist mask 420 are patterned with openings 422 that partially expose the first region 402 to define several etch sites for etching the first shallow trenches. The first photoresist mask 420 completely covers the second region 404 such that it prevents the second region 404 from being etched.

Figure 4B:
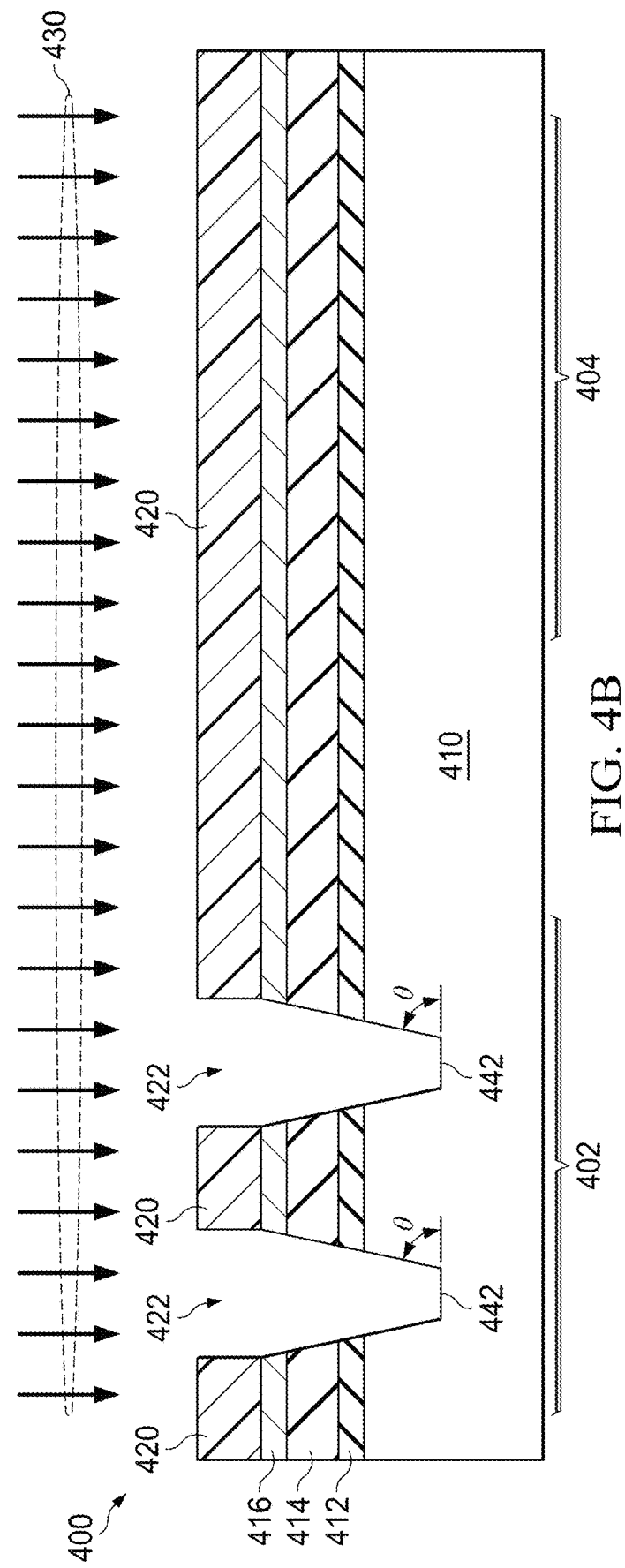

After step 312 is performed, the method 300 proceeds to step 314, which involves etching a dielectric layer above the first region exposed by the first mask. And after step 314 is performed, the method 300 proceeds to step 316, which involves etching a first shallow trench in the first region of a substrate exposed by the first mask and with a first etching parameter. With reference to FIG. 4B, for example, a first selective etch 430 is performed to first remove the dielectric layers 412, 414, 416 and then to form the first shallow trenches 442. The first selective etch 430 can be a plasma anisotropic etch with substantially the same etching steps as described with respect to FIG. 2B.

Consistent with the above disclosure, the first etching parameter includes at least one of a first silicon selectivity ratio, a first bias power for controlling the plasma etch, a first feature dimension, a first trench density, a first etch time, or a combination thereof. The first silicon selectivity ratio may be greater than 10 to achieve a threshold precision in the first feature dimension of the first shallow trench 442. Moreover, the first silicon selectivity ratio may be greater than 20 to achieve a high precision in the first feature dimension of the first shallow trench 442. As an example using an Applied Materials DPSII etcher, an etch process can be tuned to vary the selectivity ratio between silicon, nitride films, oxide films, or etch polymer by-products by varying the Cl2:O2: N2:SF6 gas ratios. For an etch process regime with source power in the 600-900 W range, bias power in the 100-200 Watt range, pressure in the 30-90 mT range, a silicon to nitride and/or oxide etch rate ratios of greater than 10 may be achieved using Cl2:O2:N2:SF6 gas flow ratios of 1:X: 0.28:Y where X may be 0 to 0.1 and Y may be 0-0.05. To achieve silicon to nitride or/oxide etch rate ratios of 20, X may be 0.05-0.2 and Y may be 0.

The first feature dimension may include a first trench width and a first inter-trench spacing. In one configuration, for example, the first trench width may range from 0.1 m to 3 m, whereas the first inter-trench spacing may have a minimum value of 0.1 m. Due to the relatively small first feature dimension, the first trench density is relatively large, which may range from 1 trench/$\mu m^2$ to 50 trench/$\mu m^2$.

The first etch time of the third plasma etch step may be less than 20 sec to achieve a threshold precision in the first feature dimension of the first shallow trench 442. Moreover, the first etch time may be less than or equal to 10 sec to achieve a high precision in the first feature dimension of the first shallow trench 442 (e.g., an etch process run using an Applied Materials DPSII etcher can be adjusted with a source power of 300-500 W, a bias power of 50-150 W, a pressure of 4-20 mT, and gas flow ratios of 1:1 for a CF4/Ar process chemistry). The first bias power for step four of the first etch parameter may be less than 250 W to achieve a threshold precision in the first feature dimension of the first shallow trench 442 Moreover, the first bias power may be less than or equal to 200 W to achieve a high precision in the first feature dimension of step 4 for the first shallow trench 442 (e.g., the fourth etch process step run using an Applied Materials DPSII etcher can be adjusted with a source power of 600-900 W, a pressure of 30-90 mT, and gas flow ratios of 1:0.15:0.30 for a Cl2/O2/N2 process chemistry).

The first shallow trenches 442 may each have a first sidewall slope θ. Because of the relatively small first feature dimension, the etching profile of the first shallow trenches 442 is relatively vertical in spite of the relatively high first silicon selectivity ratio. As such, the first sidewall slope θ is relatively large. In one implementation, for example, the first sidewall slope θ may range from 75 degrees to 95 degrees.

After step 316 is performed, the method 300 proceeds to step 318, which involves removing the first mask (e.g., the photoresist mask 420) after the etching the first shallow trench (e.g., first shallow trenches 442). The removal step can be implemented by an ash process which involves oxygen plasma possibly followed by an acidic/alkaline cleanup. Upon removing the first mask, the first shallow trench (e.g., 442) in the first region (e.g., 402) is exposed whereas the second region (e.g., 404) remains covered by the dielectric layer (e.g., 412, 414, 416).

Figure 4C:
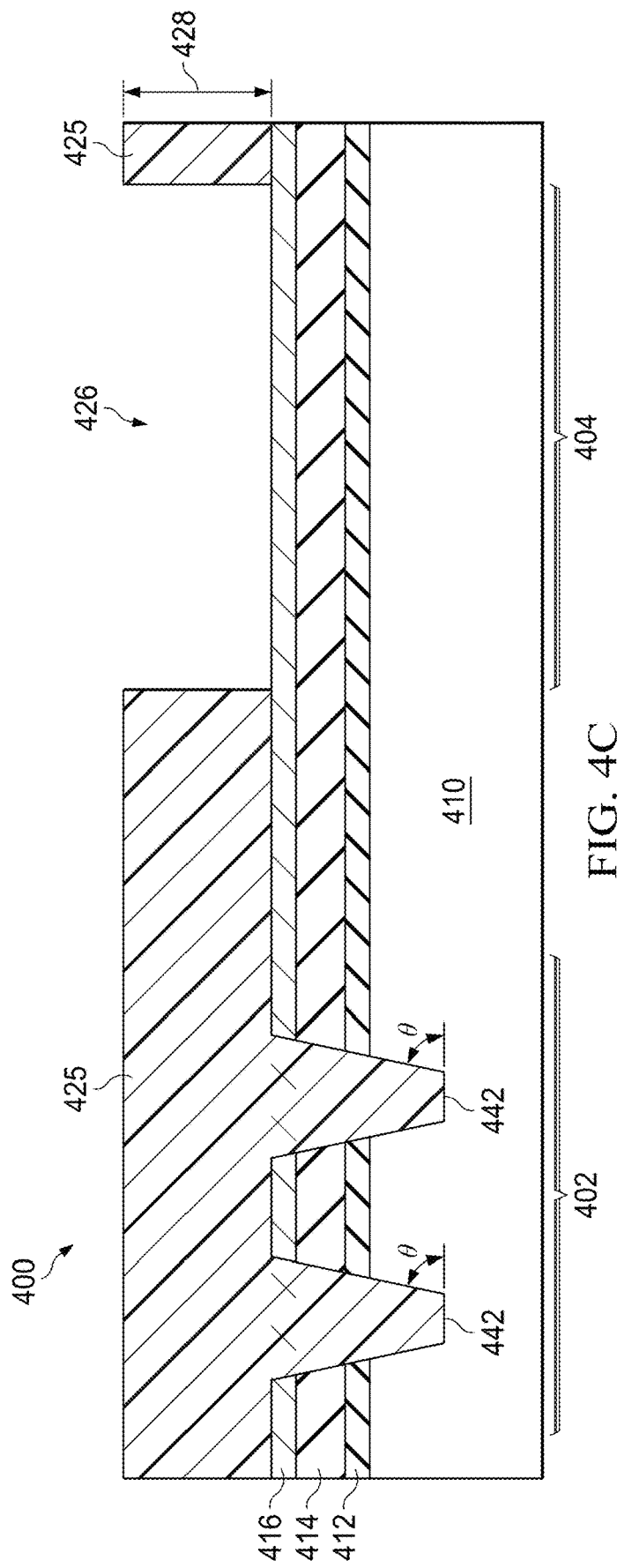

After step 318 is performed, the method 300 proceeds to step 322, which involves patterning a second mask over the substrate to partially expose the second region and cover the first region. With reference to FIG. 4C, for instance, a second photoresist mask 425 is deposited onto the stack of unetched dielectric layers. The second photoresist mask 425 are patterned with an opening 426 that partially exposes the second region 404 to define an etch site for etching the second shallow trench. Although FIG. 4C shows only one opening 426, the second photoresist mask 425 may be patterned with multiple openings 426 as well. The second photoresist mask 425 completely covers the first region 402 such that it prevents the first region 402, as well as the first shallow trenches 442 positioned therein, from being further etched.

Figure 4D:
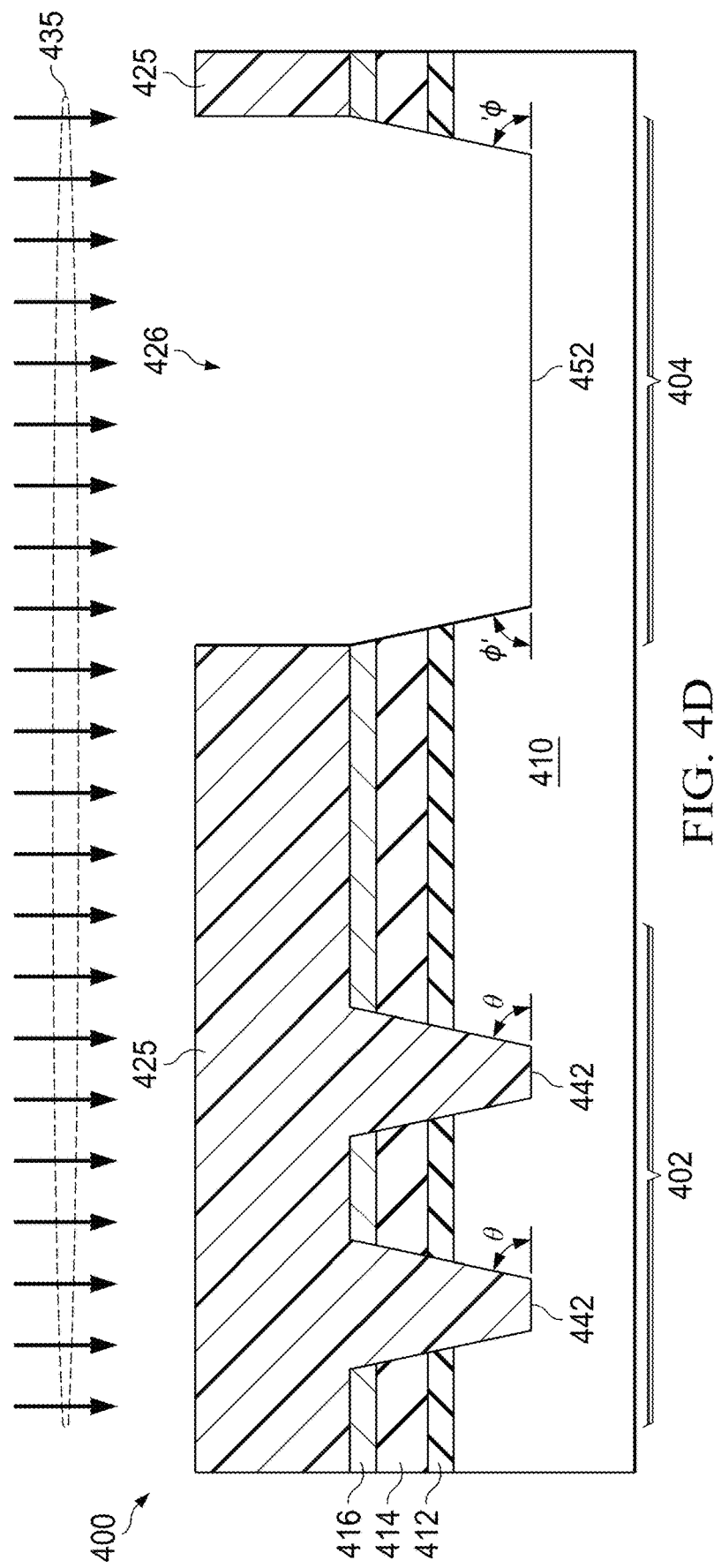

After step 322 is performed, the method 300 proceeds to step 324, which involves etching a dielectric layer above the second region exposed by the second mask. And after step 224 is performed, the method 300 proceeds to step 326, which involves etching a second shallow trench in the second region of the substrate exposed by the second mask and with a second etching parameter different from the first etching parameter. With reference to FIG. 4D, for example, a second selective etch 435 is performed to remove the dielectric layers 412, 414, 416 and then to form the second shallow trench 452. The second selective etch 435 can be a plasma anisotropic etch with substantially the same etching steps as described with respect to FIG. 2B.

Consistent with the above disclosure, the second etching parameter includes at least one of a second silicon selectivity ratio, a second bias power for controlling the plasma etch, a second feature dimension, a second trench density, a second etch time, or a combination thereof. The second silicon selectivity ratio may be less than 5 to achieve a threshold performance by reducing or minimizing trench cone formation in the second shallow trench 452. Moreover, the second silicon selectivity ratio may be less than 3 to achieve a high performance by reducing or minimizing trench cone formation in the second shallow trench 452. As an example, using an Applied Materials DPSII etcher an etch process can be tuned to vary the selectivity ratio between silicon, nitride films, oxide films, photoresist or amorphous carbon or etch polymer biproducts by varying the Cl2:HBr:CF4 gas ratios. For a etch process regime with source power in the 600-900 W range, bias power in the 100-200 Watt range, pressure in the 15-50 mT range, a silicon to nitride and/or oxide etch rate ratios of less than 5 may be achieved using Cl2:HBr:CF4 gas flow ratios of 1:4:X where X may be 0.0 to 0.1. To achieve silicon to nitride or/oxide etch rate ratio of less than 3, X may be 0.1 to 0.8.

The second feature dimension may include a second trench width and a second inter-trench spacing. In one configuration, for example, the second trench width may start from 3 m, whereas the second inter-trench spacing may start from 0.5 µm to. Due to the relatively large second feature dimension, the second trench density is relatively low, which may range from 0.001 trench/µm$^2$ to 1 trench/µm$^2$.

The second parameter etch time for the third plasma etch step may be greater than or equal to 10 sec to achieve a threshold performance by reducing or minimizing trench cone formation in the second shallow trench 452. Moreover, the second etch parameter time for the third plasma etch step may be greater than 20 sec to achieve a high performance by reducing or minimizing trench cone formation in the second shallow trench 452 (e.g., an etch process run using an Applied Materials DPSII etcher with a source power of 300-500 W, a bias power of 50-150 W, a pressure of 4-20 mT, and gas flow ratios of 1:1 for a CF4/Ar process chemistry). The bias power for step four of the second etch parameter may be greater than or equal to 250 W to achieve a threshold performance by reducing or minimizing trench cone formation in the second shallow trench 452. Moreover, the second bias power may be greater than 300 W in the fourth etch step to achieve a high performance by reducing or minimizing trench cone formation in the second shallow trench 452 (e.g., the fourth etch process step run using an Applied Materials DPSII etcher can be adjusted with a source power of 600-900 W, a pressure of 30-90 mT, and gas flow ratios of 1:0.15:0.30 for a Cl2/O2/N2 process chemistry).

The second shallow trenches 442 may each have a second sidewall slope φ. Because of the relatively low silicon selectivity ratio, the etching profile of the second shallow trench 452 is relatively vertical in spite of the relatively large second feature dimension. As such, the second sidewall slope φ is relatively large. For its correlation with a scale of by-product removal, a large second sidewall slope φ is indicative that the bottom surface of the second shallow trench 452 is substantially free of trench cones (i.e., a substantially cone-free surface). As one indication, for example, the second sidewall slope φ may be greater than 85 degrees. As another indication, for example, the second sidewall slope φ may be greater than 90 degrees. As yet another indication, for example, the second sidewall slope φ may be within a 15 degrees of deviation (e.g., plus or minus) from the first sidewall slope θ.

Because precision of the feature dimension is a lesser concern when etching the second shallow trench 452, the second photoresist mask 425 may have a second thickness 428 that is greater than a first thickness 424 of the first photoresist mask 420. The greater second thickness 428 may allow full resist coverage of the first etched area. Alternatively, the second thickness 428 may be substantially the same as the first thickness 422 in favor of a more simplistic and uniform process flow.

After step 326 is performed, the method 300 proceeds to step 328, which involves removing the second mask (e.g., the second photoresist mask 425) after the etching the second shallow trench (e.g., 452). The removal step can be implemented by an ash process which involves oxygen plasma possibly followed by an acidic/alkaline cleanup. Upon removing the second mask, the first shallow trench (e.g., 442) in the first region (e.g., 402), as well as the second shallow trench (e.g., 452) in the second region (e.g., 404), are exposed for further processes.

Figure 4E:
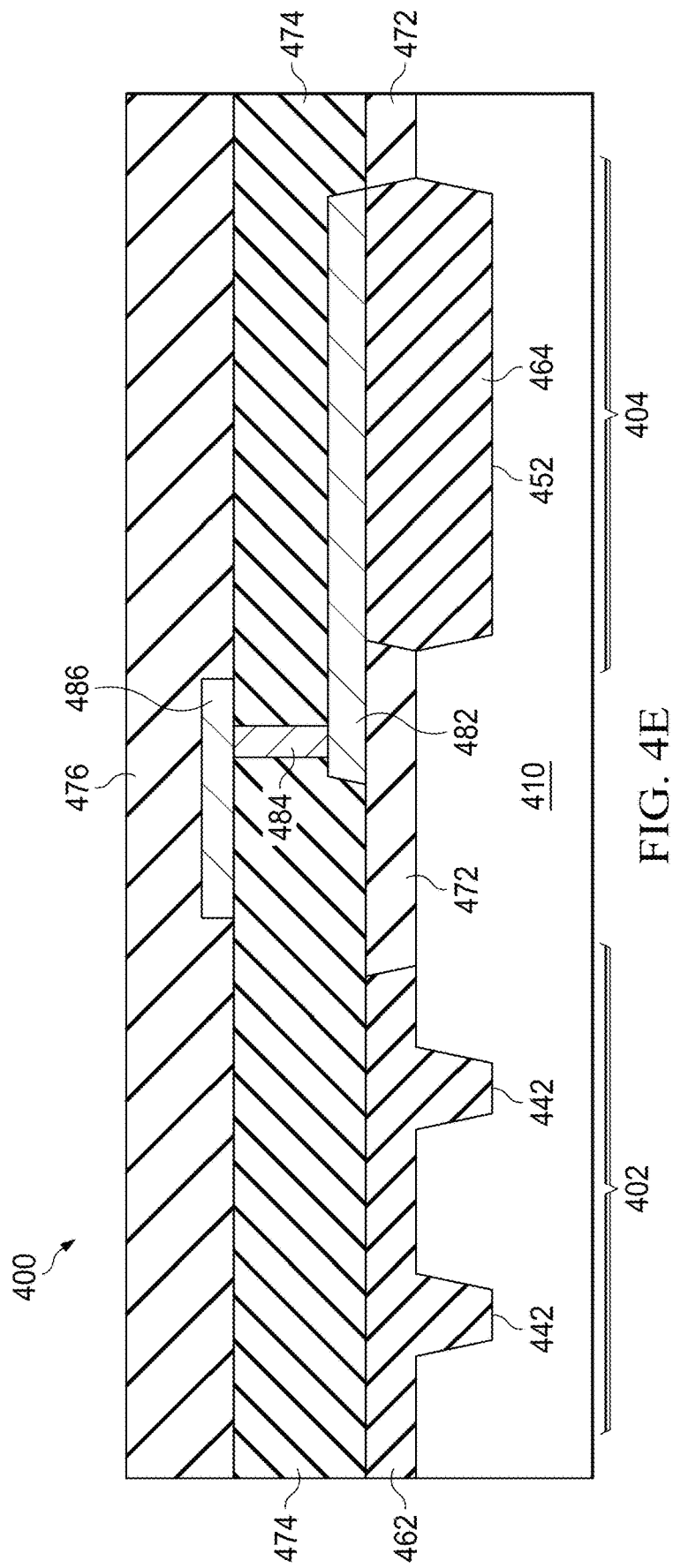

As shown in the integrated circuit 400 of FIG. 4E, for example, the dielectric layer (e.g., 412, 414, 416) are stripped away after the removal of the second photoresist mask 425. The first shallow trenches 442 are filled with a first trench dielectric 462, which may include a silicon oxide material or other suitable dielectric materials. Likewise, the second shallow trench 452 is filled with a second trench dielectric 462, which may also include a silicon dioxide material or other suitable dielectric materials. Several inter-level dielectric (ILD) layers are formed over the substrate 410, as well as the first shallow trenches 442 and the second shallow trench 464. In one implementation, for instance, the ILD layers may include a first ILD layer 472, a second ILD layer 474, and a third ILD layer 476. Each of the ILD layers 472, 474, and 476 may include a silicon oxide material or other suitable dielectric materials.

A conductive layer 482 is formed on the second trench dielectric layer 464. The conductive layer 482 may include a doped polysilicon material, a metallic material, or an alloy. The conductive layer 482 is configured to receive a high voltage and served as a circuit component 150 for vertically integrating with the second isolation structure (i.e., trench 452 and trench dielectric 464) to form a high voltage device. The conductive layer 482 may reside within the second ILD layer 472, and it may be coupled to a higher metal layer 486 through a conductive via 484. The higher metal layer 486 may in turn reside within the third ILD layer 476.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An integrated circuit, comprising:
a semiconductor substrate having a surface;
a first isolation structure along the surface, the first isolation structure having a first feature dimension and a first sidewall slope;
a second isolation structure along the surface, the second isolation structure having a second feature dimension greater than the first feature dimension, the second isolation structure having a second sidewall slope within a 15 degrees of deviation from the first sidewall slope;
a transistor structure laterally isolated by the first isolation structure; and
a circuit component integrating the second isolation structure;
wherein the first feature dimension includes a first trench width; and the second feature dimension includes a second trench width at least 2 times greater than the first trench width.

2. The integrated circuit of claim 1, wherein the circuit component includes at least one of a resistor, an inductor, or a capacitor.

3. The integrated circuit of claim 1, wherein the circuit component includes a gate structure of a lateral diffused MOS transistor.

4. The integrated circuit of claim 1, wherein the transistor structure includes at least one of a MOS transistor or a bipolar junction transistor.

5. The integrated circuit of claim 1, wherein the transistor structure includes a memory cell transistor.

6. The integrated circuit of claim 1, wherein the second sidewall slope is greater than 85 degrees.

7. An integrated circuit, comprising:
a semiconductor substrate having a surface;
a first isolation structure along the surface, the first isolation structure having a first feature dimension and a first sidewall slope;
a second isolation structure along the surface, the second isolation structure having a second feature dimension greater than the first feature dimension, the second isolation structure having a second sidewall slope within a 15 degrees of deviation from the first sidewall slope;
a transistor structure laterally isolated by the first isolation structure; and
a circuit component integrating the second isolation structure;
wherein:
the semiconductor substrate is divided into a first region and a second region;
the first isolation structure is positioned within the first region;
the second isolation structure is positioned within the second region;
wherein the first feature dimension includes a first trench width; and the second feature dimension includes a second trench width at least 2 times greater than the first trench width.

8. The integrated circuit of claim 7, wherein the circuit component includes at least one of a resistor, an inductor, or a capacitor.

9. The integrated circuit of claim 7, wherein the circuit component includes a gate structure of a lateral diffused MOS transistor.

10. The integrated circuit of claim 7, wherein the transistor structure includes at least one of a MOS transistor or a bipolar junction transistor.

11. The integrated circuit of claim 7, wherein the transistor structure includes a memory cell transistor.

12. The integrated circuit of claim 7, wherein the second sidewall slope is greater than 85 degrees.

13. An integrated circuit, comprising:
a semiconductor substrate having a surface;
a first isolation structure along the surface, the first isolation structure having a first feature dimension and a first sidewall slope;
a second isolation structure along the surface, the second isolation structure having a second feature dimension greater than the first feature dimension, the second isolation structure having a second sidewall slope within a 15 degrees of deviation from the first sidewall slope;
wherein the first feature dimension includes a first trench width; and the second feature dimension includes a second trench width at least 2 times greater than the first trench width.

14. The integrated circuit of claim 13, wherein the circuit component includes at least one of a resistor, an inductor, or a capacitor.

15. The integrated circuit of claim 13, wherein the circuit component includes a gate structure of a lateral diffused MOS transistor.

16. The integrated circuit of claim 13, wherein the transistor structure includes at least one of a MOS transistor or a bipolar junction transistor.

17. The integrated circuit of claim 13, wherein the transistor structure includes a memory cell transistor.

18. The integrated circuit of claim 13, wherein the second sidewall slope is greater than 85 degrees.

* * * * *